United States Patent
Seo et al.

(10) Patent No.: US 7,651,787 B2
(45) Date of Patent: Jan. 26, 2010

(54) ORGANIC ELECTROLUMINESCENT DEVICE

(75) Inventors: Jeong Dae Seo, Gyeonggi-do (KR); Hee Jung Kim, Seoul (KR); Kyung Hoon Lee, Seoul (KR); Hyoung Yun Oh, Seoul (KR); Myung Seop Kim, Seoul (KR); Chun Gun Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 10/779,875

(22) Filed: Feb. 18, 2004

(65) Prior Publication Data

US 2004/0161633 A1     Aug. 19, 2004

(30) Foreign Application Priority Data

Feb. 19, 2003   (KR)   .................. 10-2003-0010393

(51) Int. Cl.
*H01J 1/62*   (2006.01)
(52) U.S. Cl. .................. 428/690; 428/917; 313/504; 313/506
(58) Field of Classification Search ............ 428/690, 428/917; 313/504, 506
See application file for complete search history.

(56) References Cited

U.S. PATENT DOCUMENTS

| | | | |
|---|---|---|---|
| 6,815,094 B2 * | 11/2004 | Lee et al. ............ | 428/690 |
| 6,830,829 B2 * | 12/2004 | Suzuki et al. ........ | 428/690 |
| 7,052,351 B2 * | 5/2006 | Tutt et al. ........... | 445/24 |
| 2004/0161632 A1 * | 8/2004 | Seo et al. ............ | 428/690 |

FOREIGN PATENT DOCUMENTS

| | | |
|---|---|---|
| EP | 1221434 | 7/2002 |
| JP | 11-242996 | 9/1999 |
| JP | 11-242996 H | 9/1999 |
| JP | 11-273864 | 10/1999 |
| JP | 11-329734 | 11/1999 |
| JP | 11-329734 H | 11/1999 |
| JP | H11-354283 A | 12/1999 |
| JP | 2003-031371 | 1/2003 |

OTHER PUBLICATIONS

International Search Report Dated Aug. 30, 2004.

* cited by examiner

*Primary Examiner*—D. Lawrence Tarazano
*Assistant Examiner*—Camie S Thompson
(74) *Attorney, Agent, or Firm*—Holland & Knight LLP

(57) ABSTRACT

Disclosed is an organic electroluminescent device including a substrate, a first and second electrodes, and a light-emitting layer formed between the first electrode and the second electrode, and a hole-blocking layer formed between the light-emitting layer and the second electrode and using a material of a chemical formula 1.

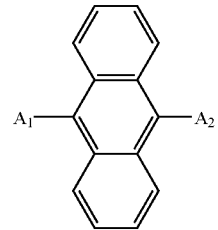

[Chemical formula 1]

In this case, at least one of $A_1$ and $A_2$ is selected from a substituted or non-substituted aromatic group, a heterocyclic group, an aliphatic group, halogen, and hydrogen.

2 Claims, No Drawings

ORGANIC ELECTROLUMINESCENT DEVICE

CROSS-REFERENCE TO RELATED APPLICATIONS

This application claims the benefit of Korean Application No. P2003-10393, filed on Feb. 19, 2003, which is hereby incorporated by reference as if fully set forth herein.

BACKGROUND OF THE INVENTION

1. Field of the Invention

The present invention relates to an organic luminescent device, and more particularly, to a hole-blocking layer.

2. Discussion of the Related Art

Recently, with the trend of a large sized display, a request of a flat display that occupies a small area has been increased. One example of the flat display is an organic electroluminescent device also called as an organic light emitting diode (OLED). And, technology for the organic electroluminescent display is developed rapidly, whereby various prototypes have been in market already.

The organic electroluminescent device emits light in a manner that electric charges are injected in an organic layer formed between an anode and a cathode so as to form a pair of electron and hole to generate an exciton and an excited state of the exciton falls to a ground state so as to emit light.

The organic electroluminescent device is not only formed on a flexible transparent substrate such as a plastic but also operated at a lower voltage (less than 10V) compared to a plasma display panel or an inorganic electroluminescent display.

Also, the organic electroluminescent device has advantages in that power consumption is reduced and various colors are available.

Moreover, the organic electroluminescent device enables to express three colors including green, blue, and red. Therefore, many concerns are focused on the organic electroluminescent device as the next generation full color display.

The organic electroluminescent device generates an exciton by coupling a hole from a hole transferring layer with an electron form the hole transferring layer, the exciton corresponding to a luminescent area.

However, the exciton can be generated by the fast transferring speed of the hole in another area except the luminescent area.

The exciton generated in another area except the luminescent area illuminates in that area only, thus, there is a problem lowering color purity and brightness.

Therefore, for increasing the performance and the brightness of the device, a material blocking a movement of the hole needs to be formed around the luminescent layer.

SUMMARY OF THE INVENTION

Accordingly, the present invention is directed to an organic electroluminescent device that substantially obviates one or more problems due to limitations and disadvantages of the related art.

An object of the present invention is to provide an organic electroluminescent device with enhanced brightness and color purity is obtained by forming a hole-blocking layer formed between the light-emitting layer and a cathode.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic electroluminescent device includes a substrate, a first and second electrodes, and a light-emitting layer formed between the first electrode and the second electrode, and a hole-blocking layer using a material of a following chemical formula 1.

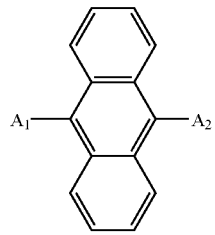

[Chemical formula 1]

In this case, at least one of $A_1$ and $A_2$ is selected from a substituted or non-substituted aromatic group, a heterocyclic group, an aliphatic group, halogen, and hydrogen.

Structures of $A_1$ and $A_2$ the same or different. At least one of $A_1$ and $A_2$ substituted or non-substituted is selected from phenyl, biphenyl, pyridyl, naphthyl, quinolyl, isoquinolyl, fluorenyl, terphenyl, methyl, ethyl, propyl, isopropyl, and halogen groups.

A substitute of the $A_1$ and $A_2$ is at least one selected from aryl, alkyl, aryloxy, alkoxy, arylamino, alkylamino, hydroxyl, amino, halogen and cyano group.

A substitute of the $A_1$ and $A_2$ is at least one selected from phenyl, biphenyl, triphenyl, phenylethenyl, diphenylethenyl, phenylethynyl, phenoxy, tolyoxy, vinyl, methyl, ethyl, propyl, isopropyl, t-butyl, cyclohexyl, diphenylamino, carbazolyl, morpholinyl, methoxy, ethoxy, propoxy, butoxy, dimethylamino, diphenylamino, fluorine and chlorine group.

It is to be understood that both the foregoing general description and the following detailed description of the present invention are exemplary and explanatory and are intended to provide further explanation of the invention as claimed.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In the present invention, a first electrode and a second electrode are formed on a in a vertical direction and a light-emitting layer is formed between the first electrode and the second electrode.

A hole-blocking layer formed between the light-emitting layer and the second electrode and using a material of a chemical formula 1.

[Chemical formula 1]

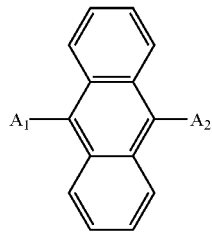

In this case, at least one of $A_1$ and $A_2$ is selected from a substituted or non-substituted aromatic group, a heterocyclic group, an aliphatic group, a halogen, and hydrogen.

Structures of $A_1$ and $A_2$ can be the same or different. Also, at least one of $A_1$ and $A_2$ is selected from a substituted or non-substituted phenyl, biphenyl, pyridyl, naphthyl, quinolyl, isoquinolyl, fluorenyl, terphenyl, methyl, ethyl, propyl, isopropyl, and halogen groups.

Each substitute of the $A_1$ and $A_2$ is at least one selected from aryl, alkyl, aryloxy, alkoxy, arylamino, alkylamino, hydroxyl, amino, halogen and cyano group.

Each substitute of the $A_1$ and $A_2$ is at least one selected from phenyl, biphenyl, triphenyl, phenylethenyl, diphenylethenyl, phenylethynyl, phenoxy, tolyoxy, vinyl, methyl, ethyl, propyl, isopropyl, t-butyl, cyclohexyl, diphenylamino, carbazolyl, morpholinyl, methoxy, ethoxy, propoxy, butoxy, dimethylamino, diphenylamino, fluorine and chlorine group.

In this case, at least one of the $A_1$ and $A_2$ may be one of the following chemical formulas 2.

[Chemical formula 2]

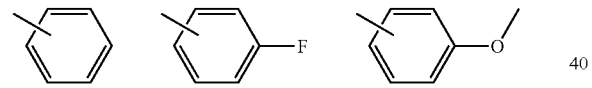

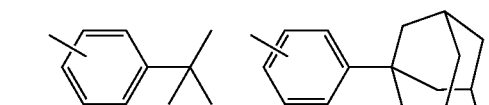

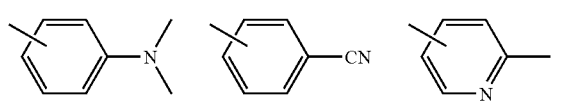

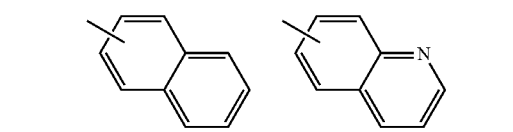

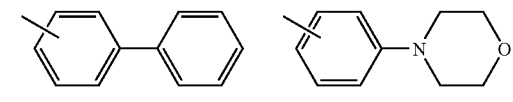

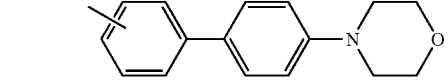

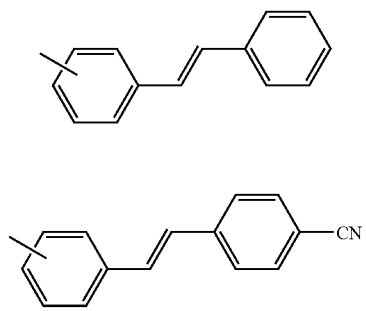

-continued

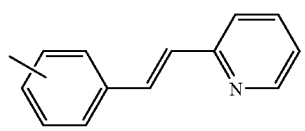

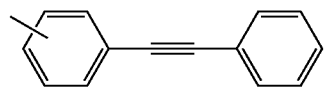

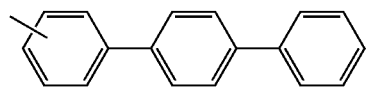

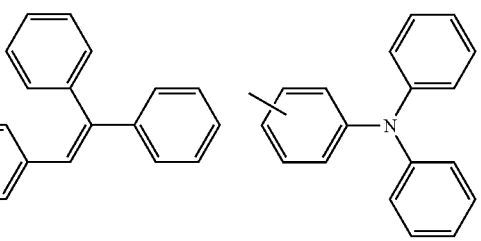

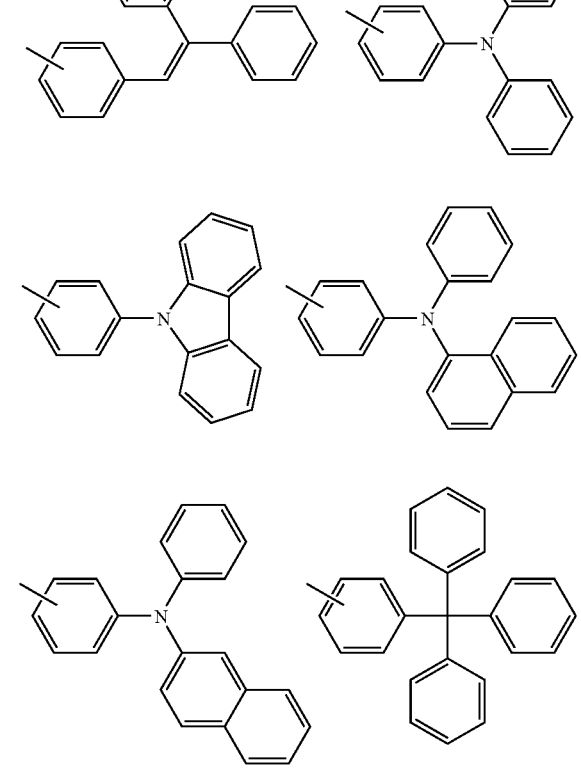

The material of the hole-blocking layer may be at least one of the following chemical formulas.

[Chemical formula 3]
B-1
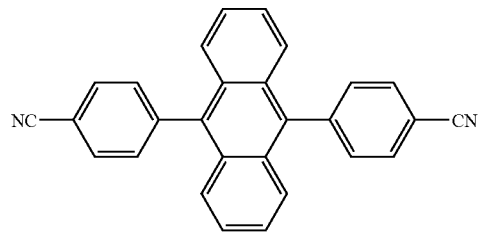
B-2
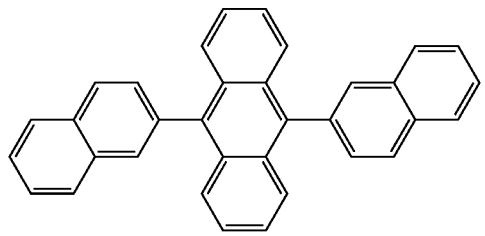
B-3
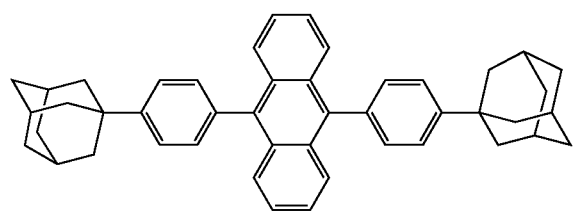
B-4
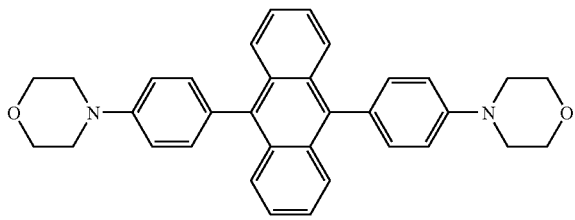
B-5
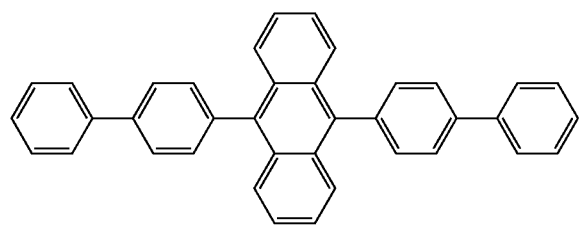
B-6
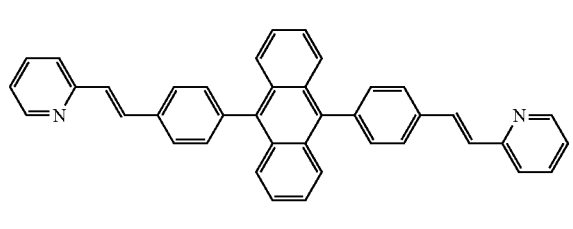
B-7
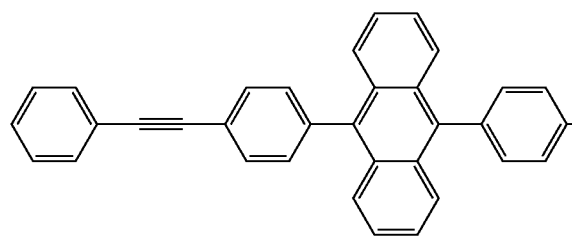
B-8
B-9
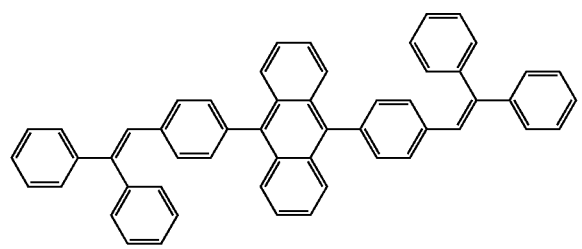
B-10
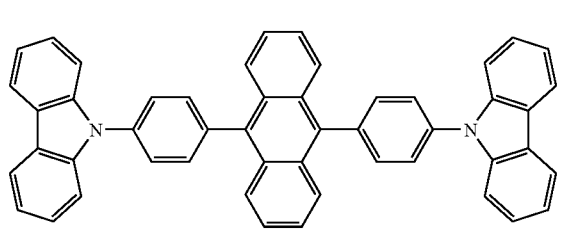
B-11
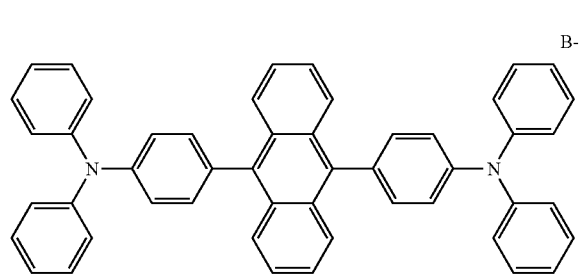

-continued
B-12
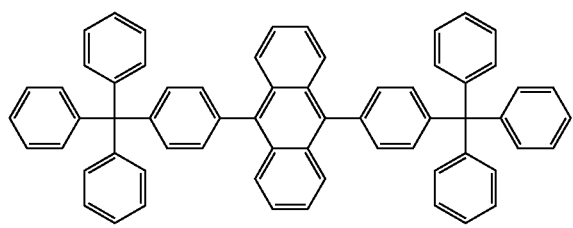
B-13
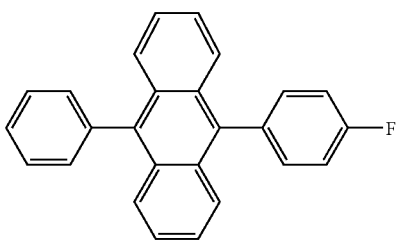
B-14
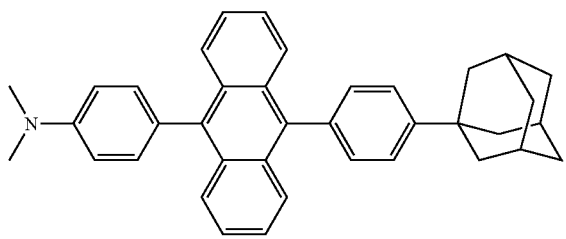
B-15
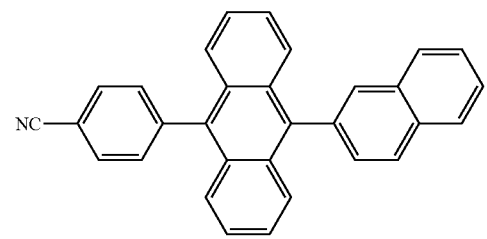
B-16
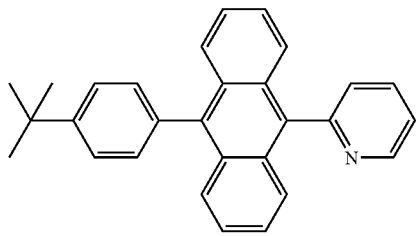
B-17
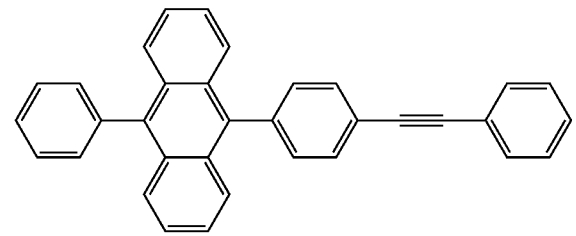
B-18
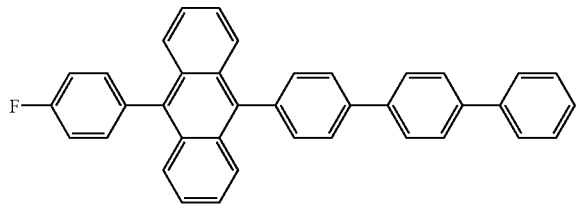
B-19
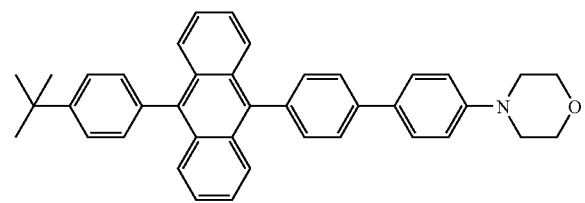
B-20
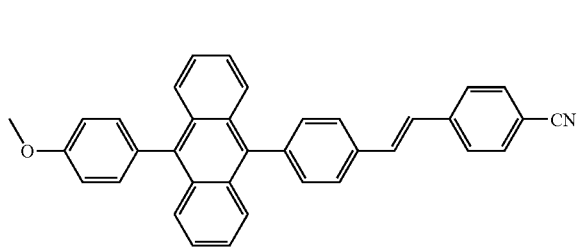
B-21
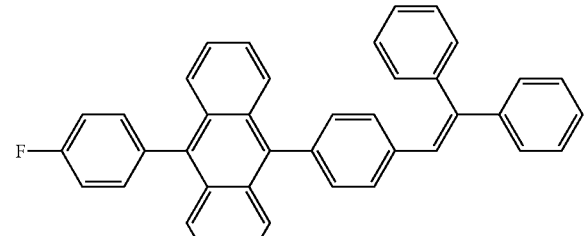
B-22
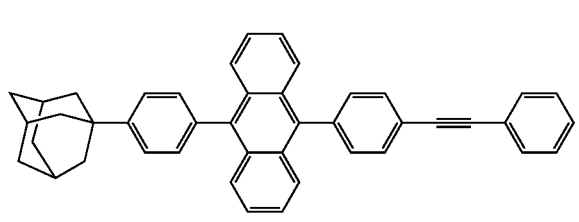
B-23
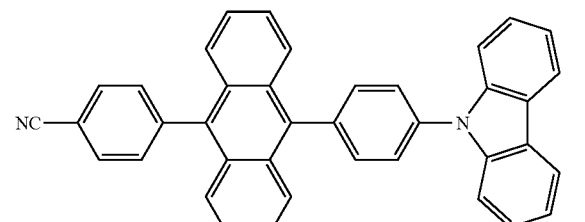

-continued
B-24
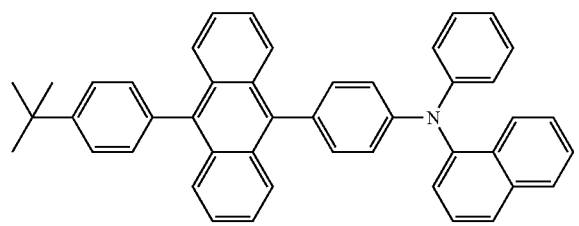
B-25
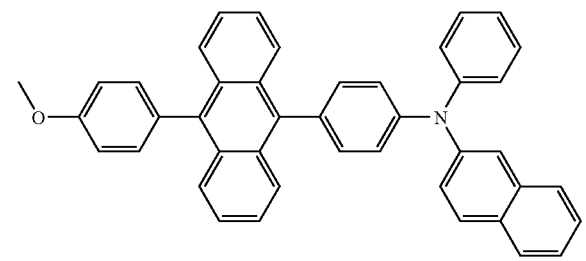
B-26
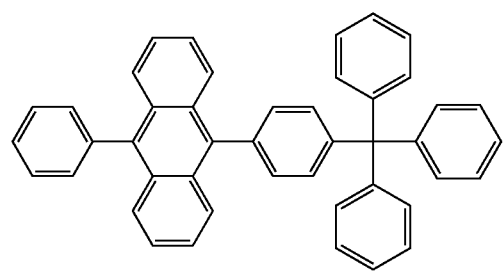
B-27
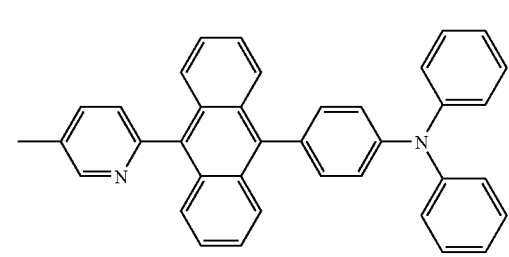
B-28
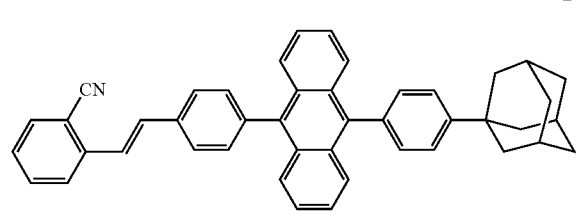
B-29
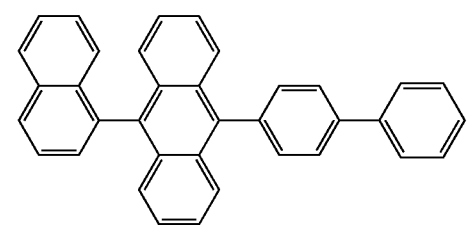
B-30
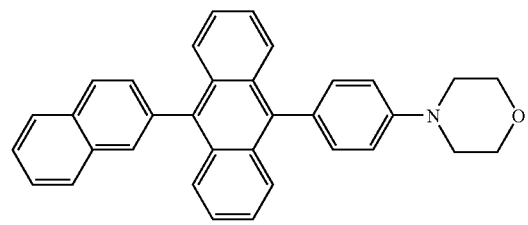
B-31
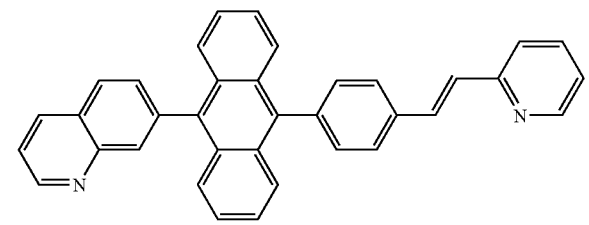
B-32
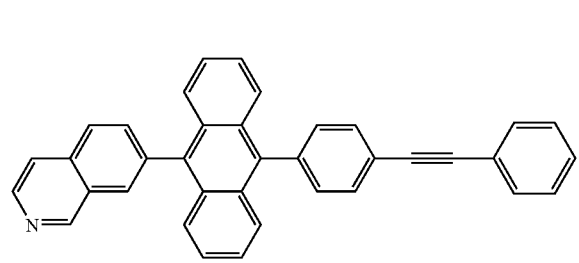
B-33
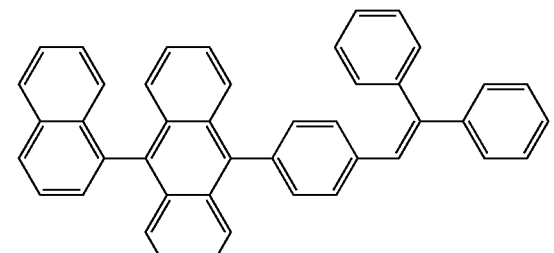
B-34
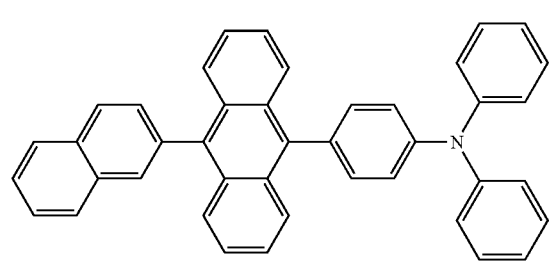
B-35
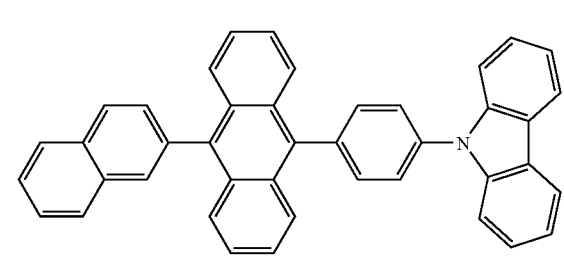

-continued
B-36
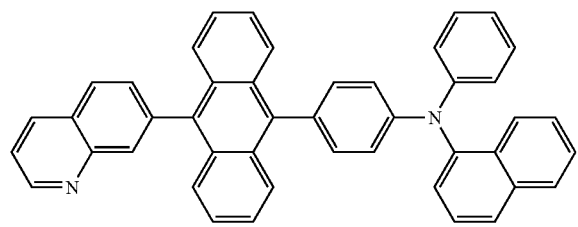
B-37
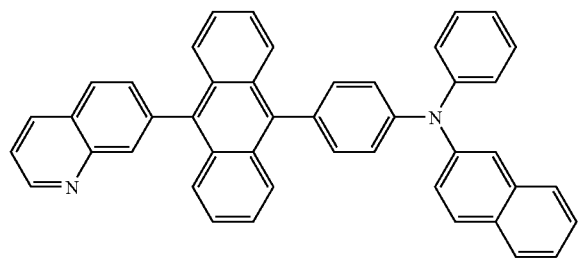
B-38
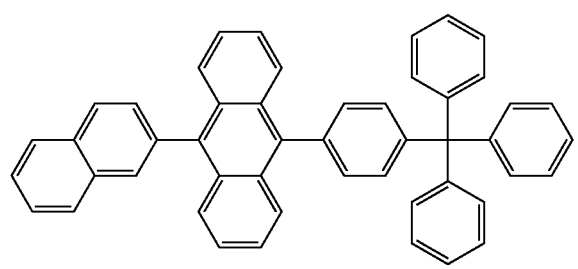
B-39
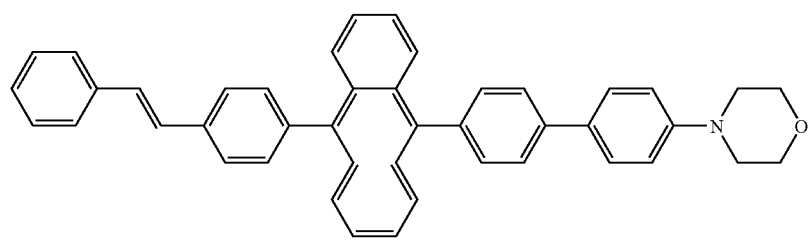
B-40
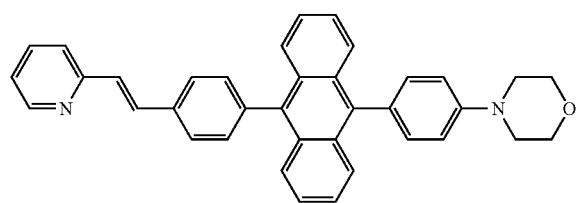
B-41
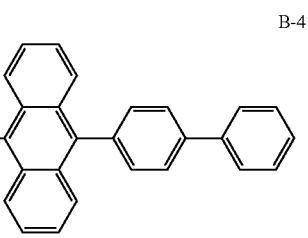
B-42
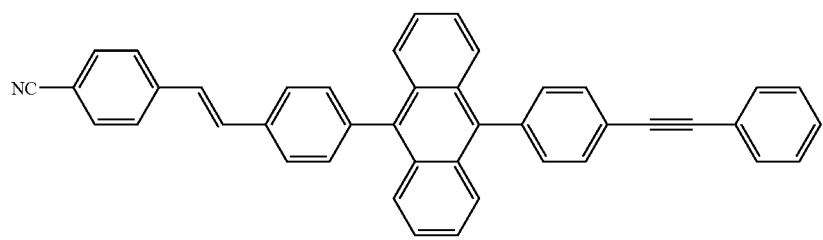
B-43
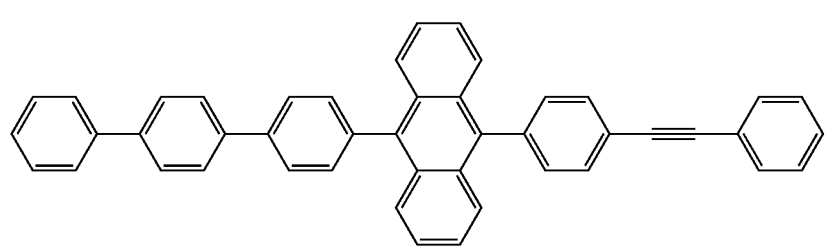

-continued
B-44 B-45
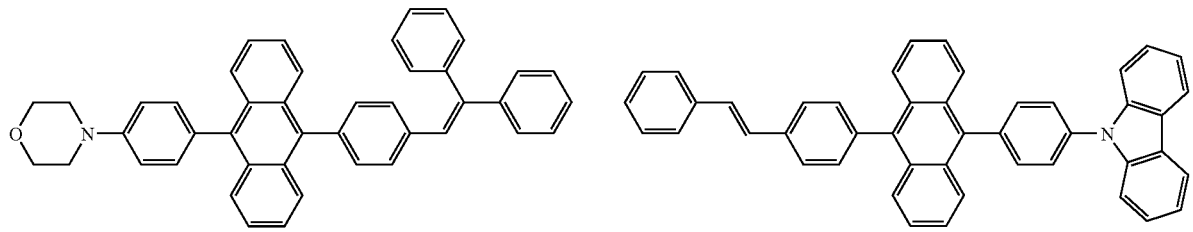
B-46 B-47
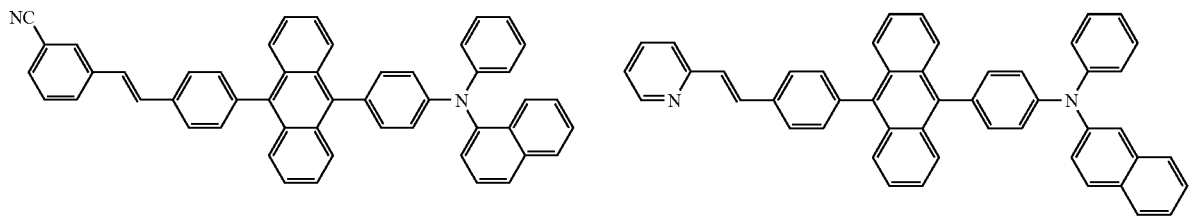
B-48
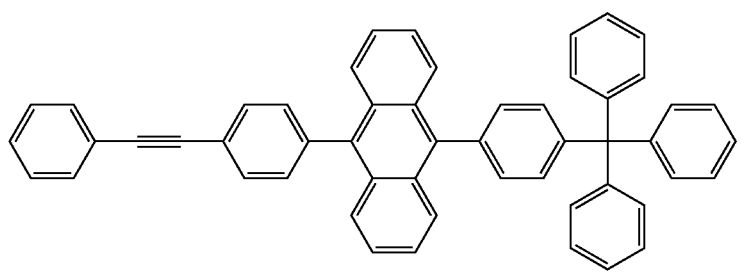
B-49
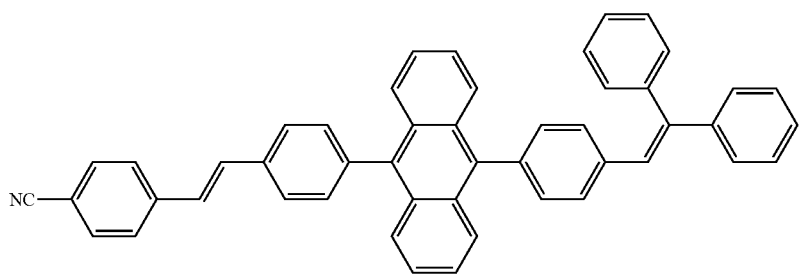
B-50 B-51
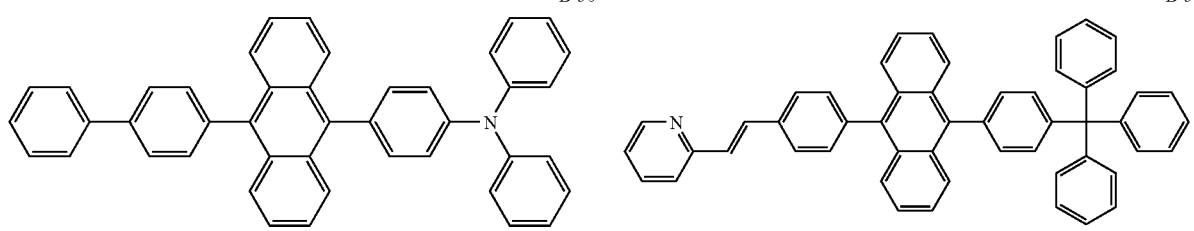
B-52 B-53
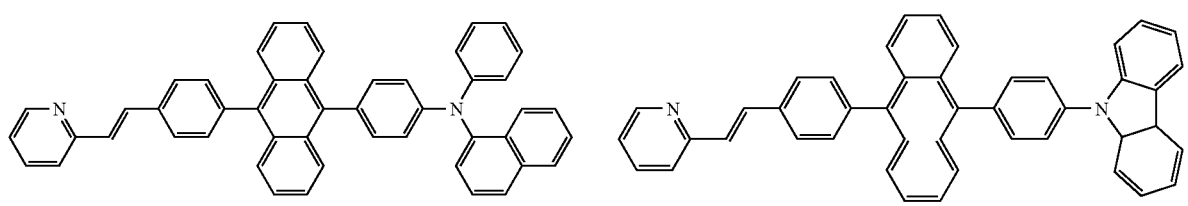

-continued
B-54
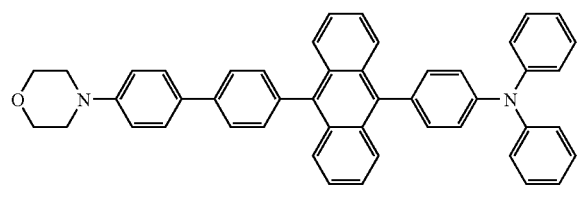
B-55
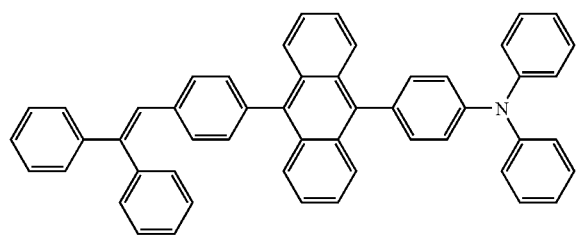
B-56
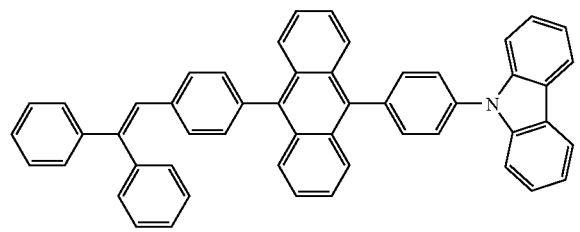
B-57
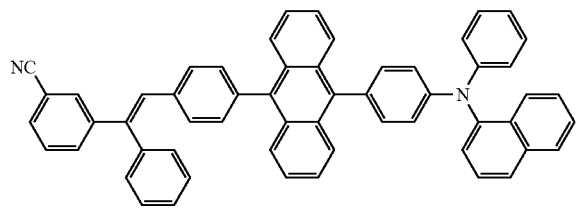
B-58
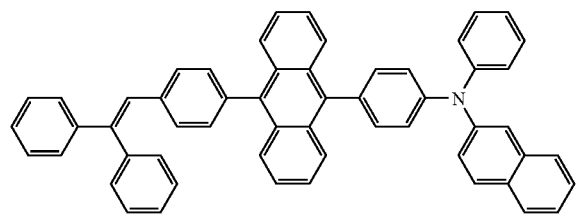
B-59
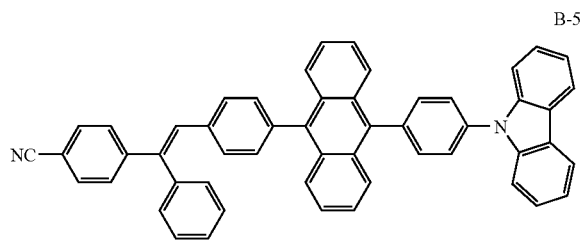
B-60
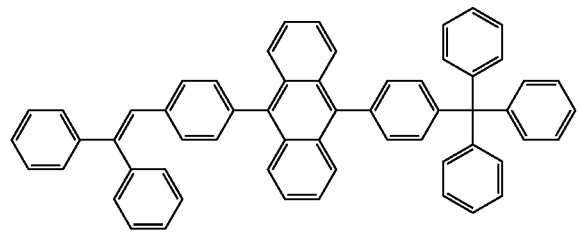
B-61
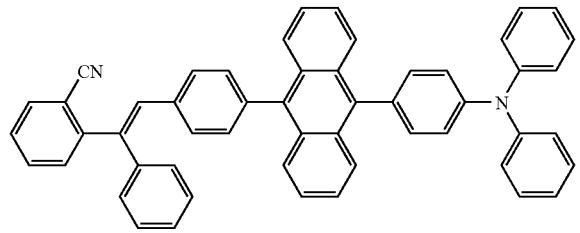
B-62
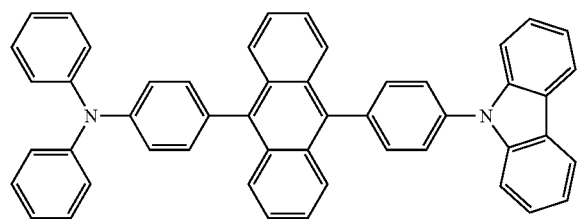
B-63
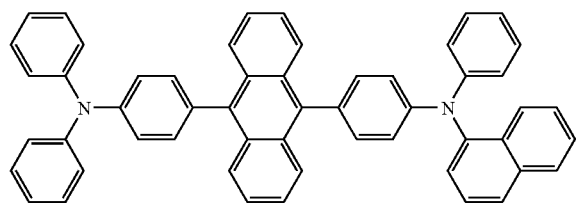
B-64
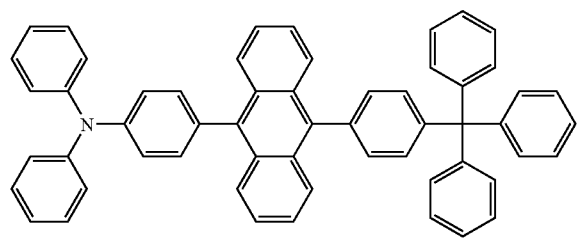
B-65
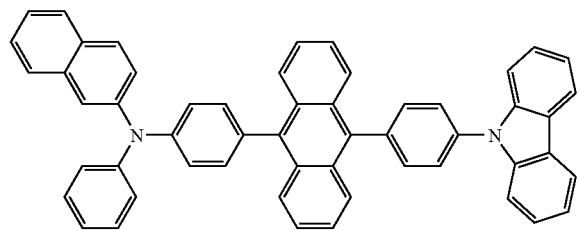

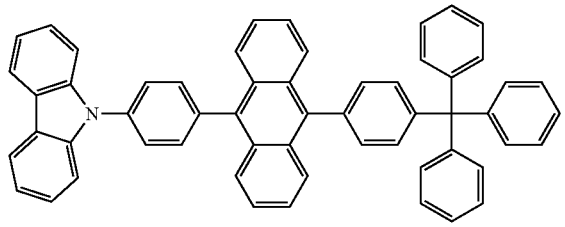

B-66

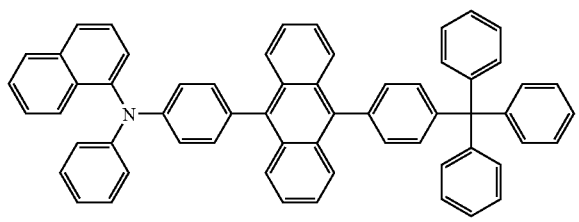

B-67

According to the organic luminescent device of the present invention, (9-[4-(2,2-diphenyl-vinyl)-phenyl]-10-(4-trityl-phenyl)-anthracene), that is the B-60 used as the hole-blocking layer is compounded as follows.

(1) Synthesis of tetraphenylmethyl boronic acid

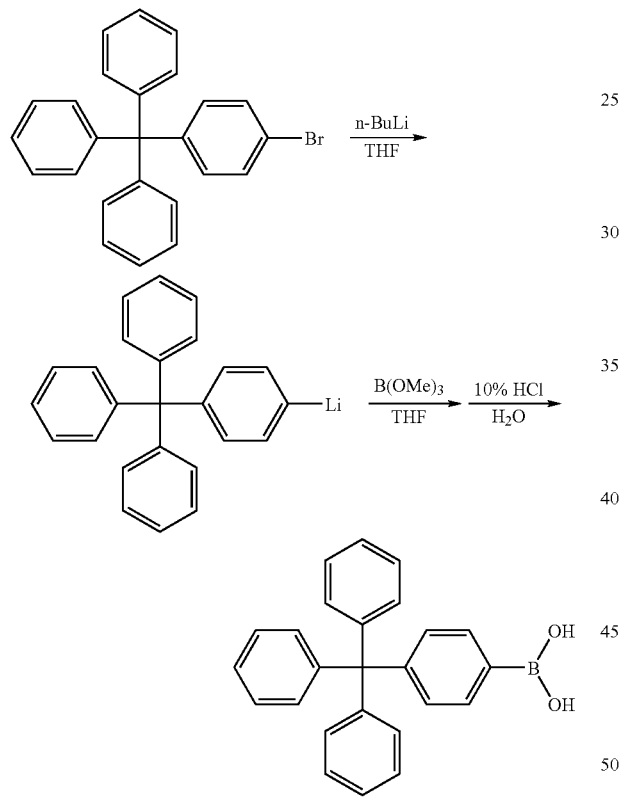

First of all, 4-Bromotetra phenylmethane (1.62 g, 0.005 mol) is dissolved in THF (120 ml) in a dry 3-necks-r.b.f. 1.6 M of n-BuLi (3.9 mL, 0.006 mol) melted in hexane is slowly added to the bath at −78° C. for ten minutes and the solution is stirred for 30 minutes at a room temperature.

And, after providing a bath at −78° C., trimethylborate (0.92 ml, 00081 mol) is slowly added into the bath at −78° C. and stirred for 12 hours at a room temperature.

Then, about 10% of HCl is slowly added into the bath at 0° C. for making pH 2 or 3, and a resuted solution is extracted by using diethylether and distilled under a reduced pressure.

And, when a deposit is formed by petroleum ether, the solvent is filtered whereby a white solid matter (1.25 g, 84%) of tetraphenylmethyl boronic acid is obtained.

(2) Synthesis of 9-Bromo-10-(4-trityl-phenyl)-anthracene

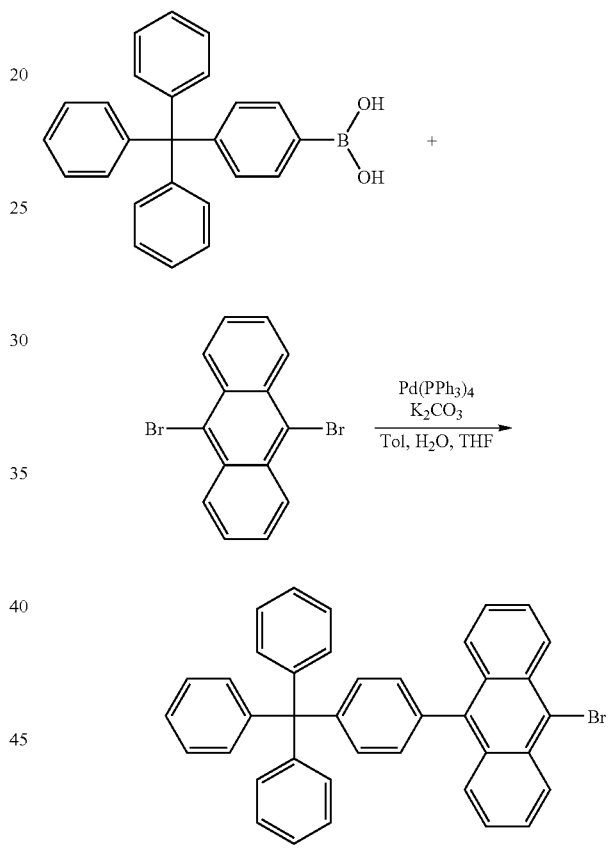

First, tetraphenylmethyl boronic acid (1.19 g, 0.003 mol), 9,10-DibromoAnthracene (2.74 g, 0.008 mol), tetrakis(triphenylphosphine) palladium(0) (0.19 g, 0.05 eq), Potassium carbonate (1.81 g, 0.013 mol) melted into Toluene (50 mL), THF (50 mL), and $H_2O$ (50 mL) are admitted into a two-neck-r.b.f. The solution is heated in a hot oil bath at about 100° C. and stirred for 24 hours. When the reaction is finished, THF and toluene are removed.

And, after extracting a resulted solution by using Dichloromethane and water, the resulted solution is distilled under reduced pressure whereby silica gel column is obtained. The solution is re-crystallized by using Dichloromethane and methanol and filtered whereby a yellow solid matter, namely, 9-Bromo-10-(4-trityl-phenyl)-anthracene (0.98 g, 53%) is obtained.

(3) Synthesis of (9-[4-(2,2-Diphenyl-vinyl)-phenyl]-10-(4-trityl-phenyl)-anthracene)

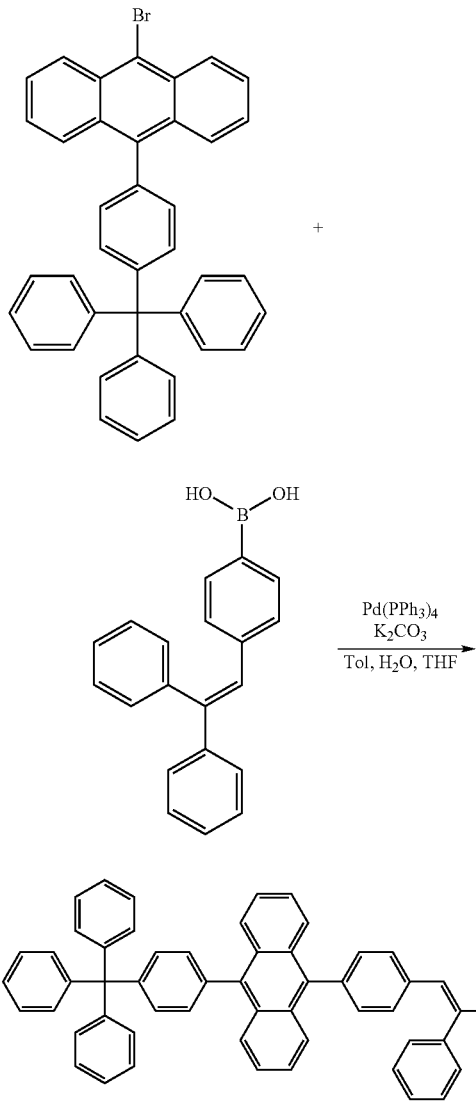

9-Bromo-10-(4-trityl-phenyl)-anthracene (0.35 g, 0.0006 mol), 4-(2,2-Diphenyl-vinyl)-phenyl boronic acid (0.26 g, 0.0009 mol), tetrakis (triphenyl-phosphine)palladium(0) (0.035 g, 0.05 eq), Potassium carbonate (0.25 g, 0.002 mol) melted into Toluene (30 mL), THF (30 mL), $H_2O$ (30 mL) are admitted into a two-neck-r.b.f. The solution is heated in a hot oil bath at about 100° C. and stirred for 24 hours. When the reaction is finished, THF and toluene are removed.

Silica gel column is obtained from the resulted solution by using a ratio of Dichloromethane:Hexane=1:50.

The solvent is distilled under reduced pressure whereby a yellow solid matter of 9-Bromo-10-(4-trityl-phenyl)-anthracene (0.98 g, 53%) is obtained.

The solvent is distilled under reduced pressure and filtered by using methanol, whereby a yell solid matter of 9-[4-(2,2-Diphenyl-vinyl)-phenyl]-10-(4-trityl-phenyl)-anthracene (0.42 g, 91%) is obtained.

Hereinafter, a preferred embodiment of the organic electroluminescent device will be described according to the present invention.

Embodiment

An ITO glass is patterned so as to have a size of 2 mm×2 mm. The patterned ITO glass is then cleaned.

A substrate is loaded on a vacuum chamber of which basic pressure is set up as $1 \times 10^{-6}$ torr and CuPC (200 Å), NPD (400 Å), CBP+(btp)$_2$Ir(acac) (8%) (200 Å), the hole-blocking layer (100 Å), $Alq_3$ (300 Å), LiF (5 Å), Al (100 Å) are deposited on the ITO in order.

When B-60 is used as the hole-blocking layer, 1135 cd/m$^2$ (9.30V) is shown at about 1 mA, brightness shows about 3.2 cd/A, whereby CIE is x=0.661, y=0.328.

Comparative Embodiment

The ITO glass is patterned so as to have a size of 3 mm×3 mm. The patterned ITO glass is then cleaned. A substrate is loaded on a vacuum chamber of which basic pressure is set up as $1 \times 10^{-6}$ torr and CuPC (200 Å), NPD (400 Å), CBP+(btp)$_2$Ir(acac) (8%) (200 Å), a light-emitting layer (100 Å), $Alq_3$ (300 Å), LiF (5 Å), Al (100 Å) are deposited on the ITO in order.

When Balq is used as the hole-blocking layer, 1018 cd/m$^2$ (9.97V)1135 cd/m$^2$(9.30V) is shown at about 1 mA, brightness shows about 1018 cd/m$^2$(9.97V), whereby CIE x=0.659, y=0.329. Lifetime (half of first brightness) shows 2000 cd/m$^2$ at about 1 mA.

Accordingly, the present invention is the organic elecroluminescent device including the hole-blocking layer between the anode and cathode. The organic elecroluminescent device with enhanced brightness and color purity is obtained through the hole-blocking layer.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescent device, comprising:
   a substrate;
   first and second electrodes formed on the substrate;
   a light-emitting layer formed between the first electrode and the second electrode; and
   a hole-blocking layer formed between the light-emitting layer and the second electrode and using a material of a chemical formula 1

[Chemical formula 1]

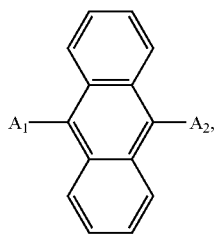

wherein the A1 and A2 is one of the following chemical formulas 2, respectively

[Chemical formula 2]

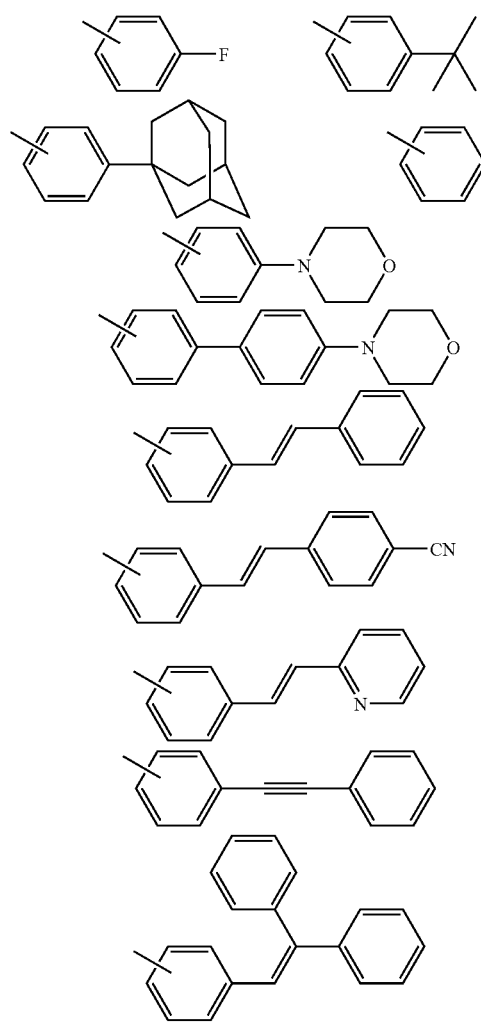

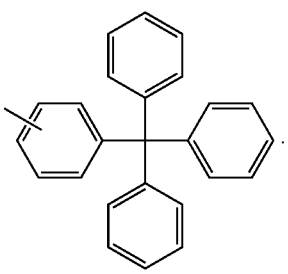

-continued

2. An organic electroluminescent device, comprising:
a substrate;
first and second electrodes formed on the substrate;
a light-emitting layer formed between the first electrode and the second electrode; and
a hole-blocking layer formed between the light-emitting layer and the second electrode and using a material of a chemical formula 1

[Chemical formula 1]

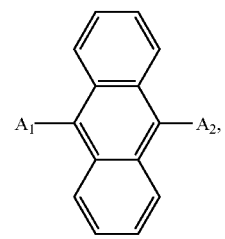

wherein a material of the hole-blocking layer is one of the following chemical formula 3

[Chemical formula 3]

B-1

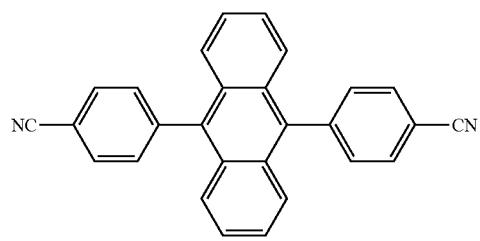

B-3

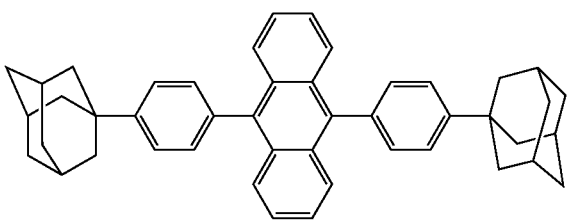

B-4

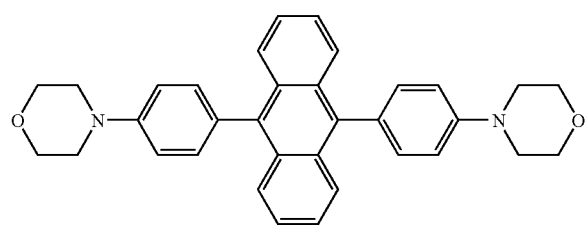

B-6

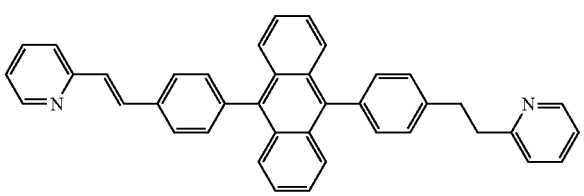

-continued
B-7
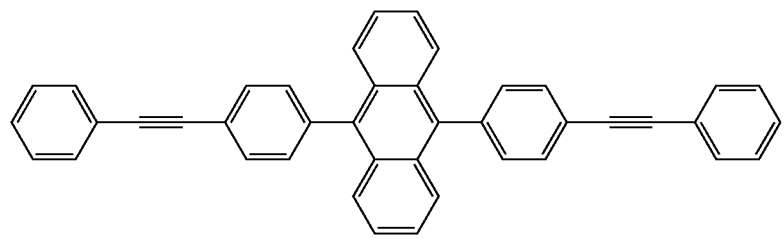
B-8
B-12
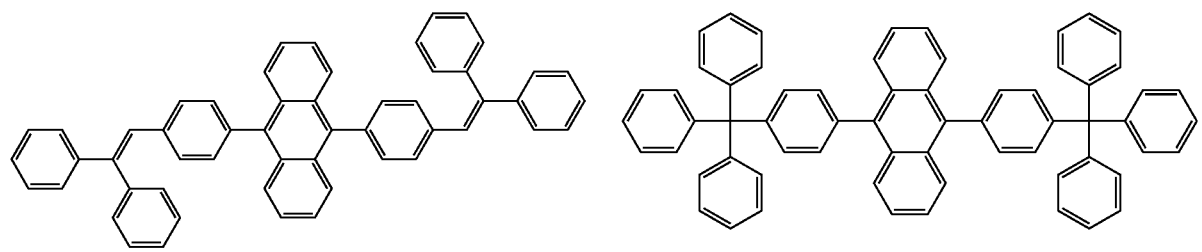
B-13
B-14
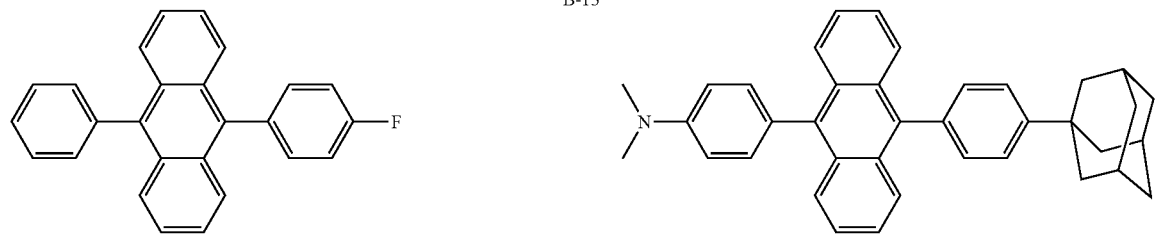
B-15
B-16
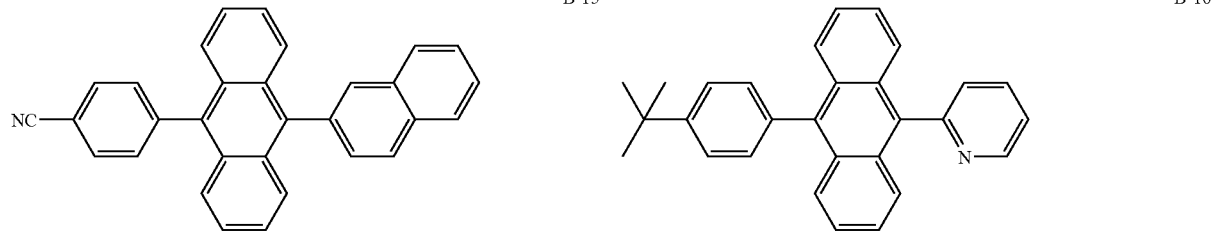
B-17
B-18
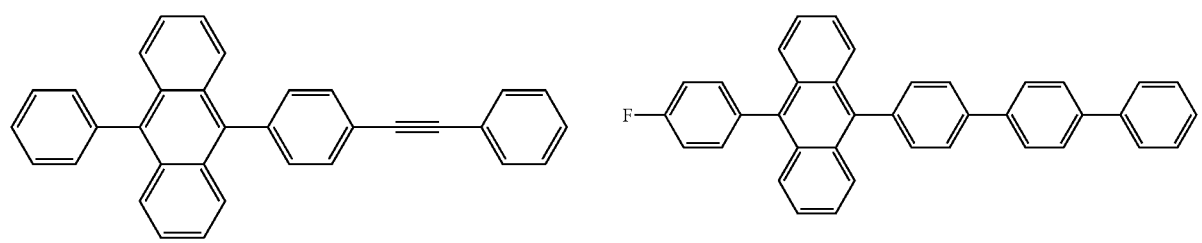
B-19
B-20
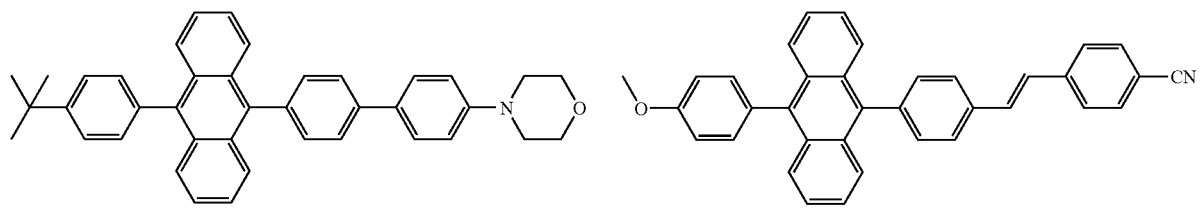

-continued
B-21 B-22
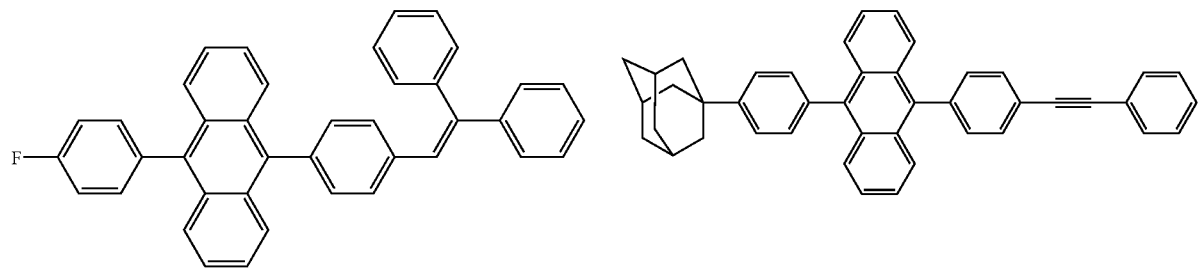
B-26 B-28
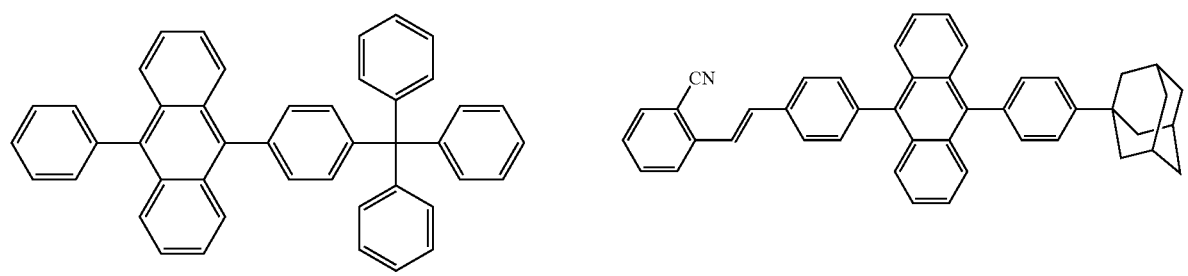
B-30 B-31
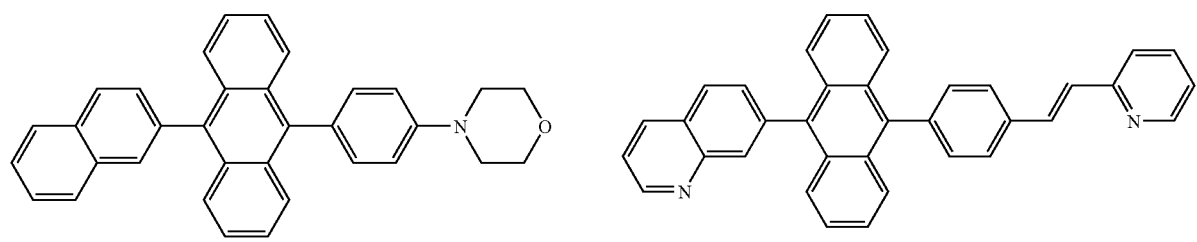
B-32 B-33
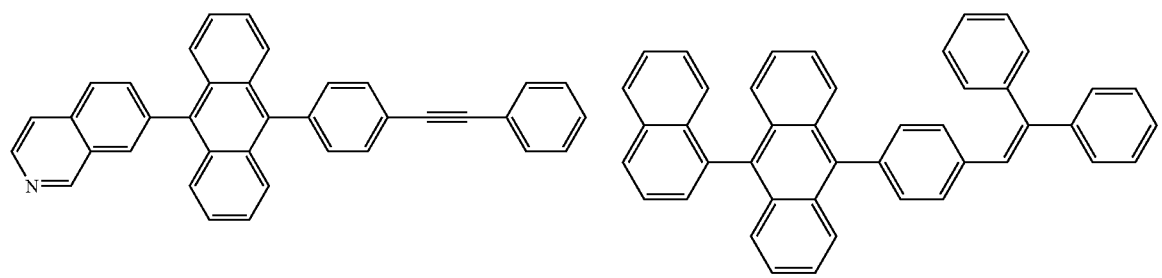
B-38
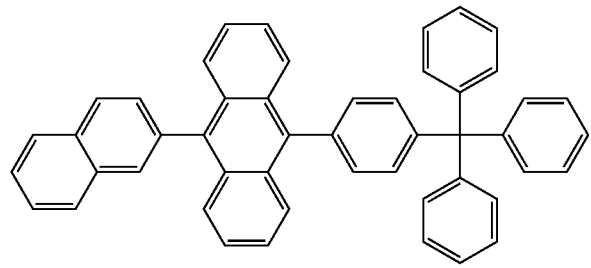

-continued
B-39
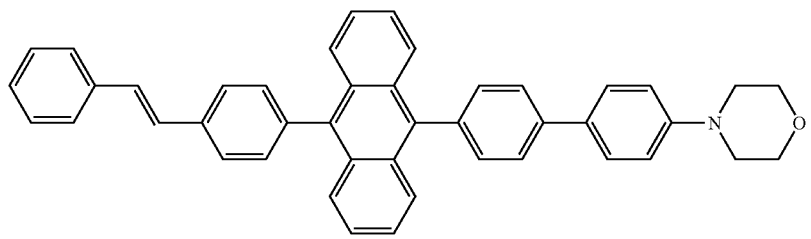
B-40
B-41
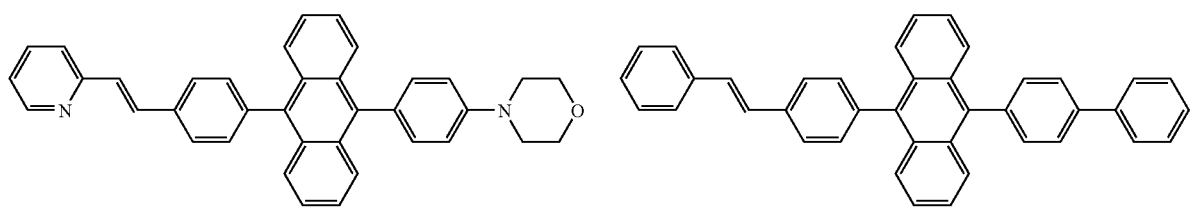
B-42
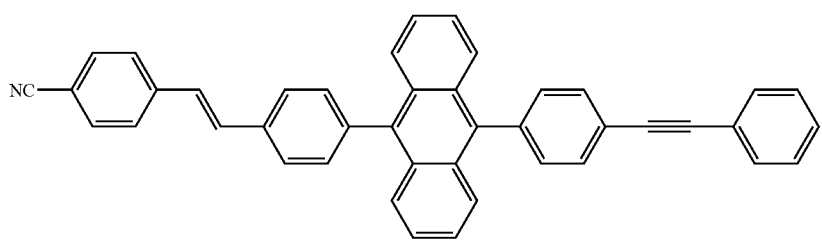
B-43
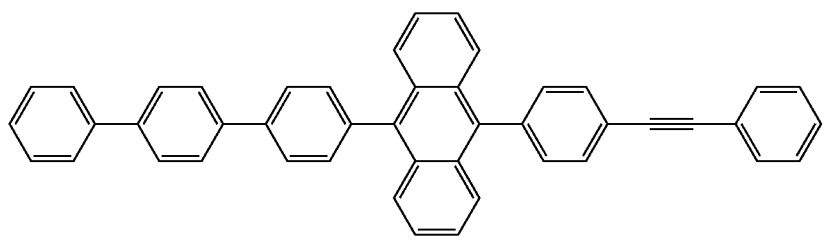
B-44
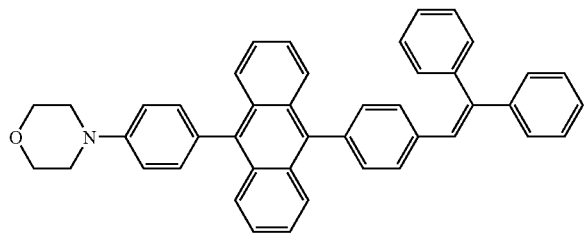
B-48
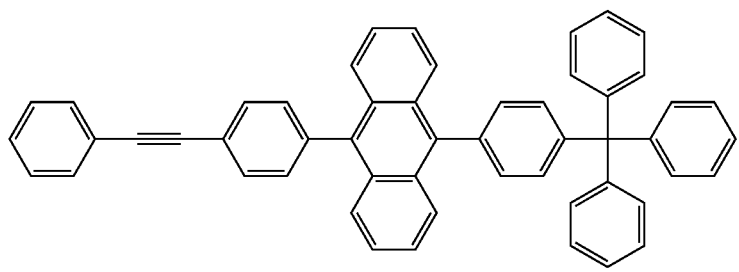

-continued
B-49
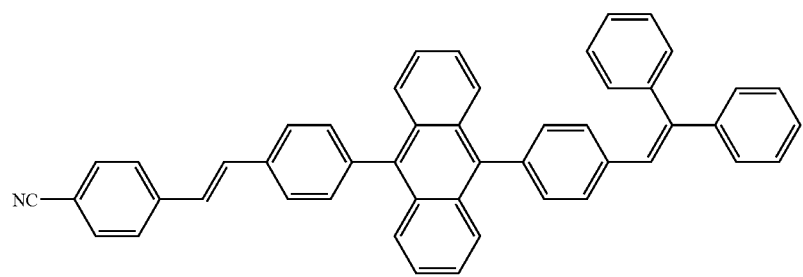
B-51 B-60
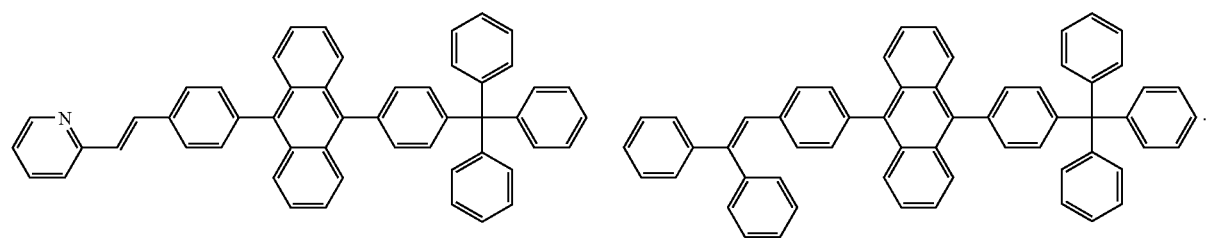
* * * * *